US011127825B2

(12) United States Patent
Park et al.

(10) Patent No.: US 11,127,825 B2
(45) Date of Patent: Sep. 21, 2021

(54) MIDDLE-OF-LINE CONTACTS WITH VARYING CONTACT AREA PROVIDING REDUCED CONTACT RESISTANCE

(71) Applicant: International Business Machines Corporation, Armonk, NY (US)

(72) Inventors: Chanro Park, Clifton Park, NY (US); Kangguo Cheng, Schenectady, NY (US); Ruilong Xie, Niskayuna, NY (US); Hari Prasad Amanapu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 16/361,976

(22) Filed: Mar. 22, 2019

(65) Prior Publication Data

US 2020/0303264 A1    Sep. 24, 2020

(51) Int. Cl.
*H01L 29/417* (2006.01)
*H01L 21/768* (2006.01)
*H01L 21/8234* (2006.01)
*H01L 29/78* (2006.01)

(52) U.S. Cl.
CPC .. *H01L 29/41791* (2013.01); *H01L 21/76802* (2013.01); *H01L 21/823431* (2013.01); *H01L 21/823475* (2013.01); *H01L 29/41775* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 4,978,420 | A | 12/1990 | Bach |
| 5,286,344 | A | 2/1994 | Blalock et al. |
| 6,326,296 | B1 | 12/2001 | Tsai et al. |
| 7,176,120 | B2 | 2/2007 | Kanamura |
| 8,765,585 | B2 | 7/2014 | Fan et al. |
| 8,916,337 | B2 | 12/2014 | Arnold et al. |
| 9,412,648 | B1 | 8/2016 | Shiu et al. |
| 9,412,840 | B1 | 8/2016 | Leobandung et al. |
| 9,570,397 | B1 | 2/2017 | Fan et al. |
| 2017/0345759 | A1 | 11/2017 | Lin |

(Continued)

*Primary Examiner* — Zandra V Smith
*Assistant Examiner* — Molly K Reida
(74) *Attorney, Agent, or Firm* — Erik Johnson; Ryan, Mason & Lewis, LLP

(57) ABSTRACT

A method of forming a semiconductor structure includes forming a first portion of a source/drain contact over a source/drain region of a fin-type field-effect transistor (FinFET), the source/drain region being formed over a fin providing a channel region of the FinFET and being adjacent a gate spacer surrounding a gate region of the FinFET. The method also includes forming a first interlayer dielectric (ILD) layer over the first portion of the source/drain contact, the gate spacer and the gate region, and forming a second ILD layer over the first ILD layer. The method further includes forming a second portion of the source/drain contact over the first portion of the source/drain contact in a first opening in the first ILD layer, and forming a third portion of the source/drain contact over the second portion of the source/drain contact in a second opening in the second ILD layer. The second opening is larger than the first opening.

20 Claims, 9 Drawing Sheets

(56) References Cited

U.S. PATENT DOCUMENTS

2019/0088542 A1\* 3/2019 Hsieh ................ H01L 21/76805
2020/0051906 A1\* 2/2020 Liaw ................ H01L 21/76829
2020/0066597 A1\* 2/2020 Cheng ................ H01L 29/7851

\* cited by examiner

200

400

500

700

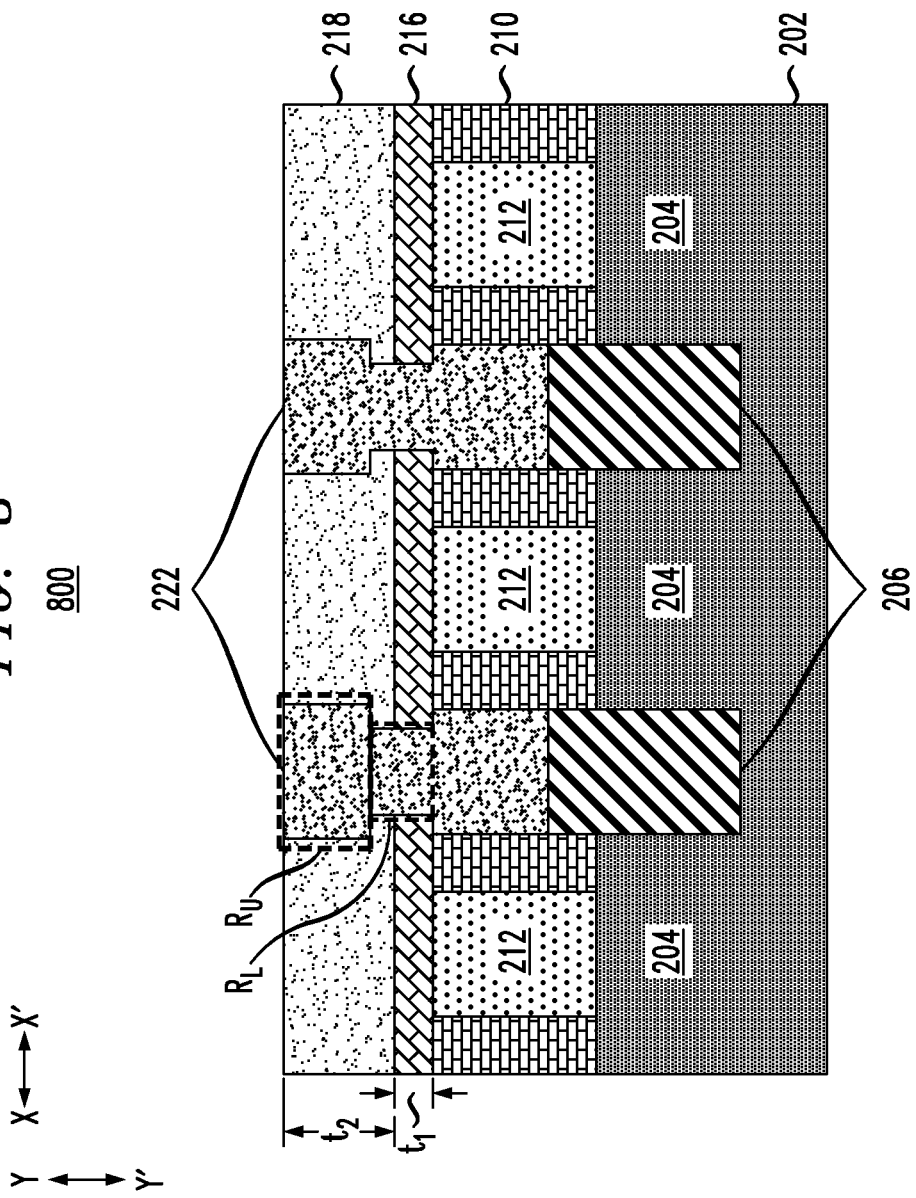

MIDDLE-OF-LINE CONTACTS WITH VARYING CONTACT AREA PROVIDING REDUCED CONTACT RESISTANCE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming middle-of-line (MOL) contacts, such as source/drain contacts for fin-type field-effect transistors (FinFETs), which have varying contact area to reduce MOL contact resistance. Such varying contact area may be used for forming MOL contacts with reduced contact resistance while preventing undesired shorting, such as shorting of MOL source/drain contacts to gate regions in devices such as FinFETs with tight pitched gate structures.

In one embodiment, a method of forming a semiconductor structure comprises forming a first portion of at least one source/drain contact over at least one source/drain region of at least one FinFET, the at least one source/drain region being formed over at least one fin providing at least one channel region of the at least one FinFET, the at least one source/drain region being adjacent at least one gate spacer surrounding at least one gate region of the at least one FinFET. The method also comprises forming a first interlayer dielectric layer over the first portion of the at least one source/drain contact, the at least one gate spacer and the at least one gate region, and forming a second interlayer dielectric layer over the first interlayer dielectric layer. The method further comprises forming a second portion of the at least one source/drain contact over the first portion of the at least one source/drain contact in a first opening in the first interlayer dielectric layer, and forming a third portion of the at least one source/drain contact over the second portion of the at least one source/drain contact in a second opening in the second interlayer dielectric layer. The second opening is larger than the first opening.

In another embodiment, a semiconductor structure comprises at least one fin disposed over a substrate, the at least one fin providing at least one channel region of at least one FinFET. The semiconductor structure also comprises at least one gate region of the at least one FinFET surrounding the at least one channel region of the at least one fin, at least one gate spacer surrounding the at least one gate region, and at least one source/drain region of the at least one FinFET disposed over a portion of the at least one fin adjacent the at least one gate spacer. The semiconductor structure further comprises a first interlayer dielectric layer disposed over the first portion of the at least one source/drain contact, the at least one gate spacer and the at least one gate region, and a second interlayer dielectric layer disposed over the first interlayer dielectric layer. The semiconductor structure further comprises at least one source/drain contact to the at least one source/drain region, the at least one source/drain contact comprising a first portion disposed over the at least one source/drain region, a second portion disposed over the first portion in a first opening in the first interlayer dielectric layer, and a third portion disposed over the second portion in a second opening in the second interlayer dielectric layer. The second opening is larger than the first opening.

In another embodiment, an integrated circuit comprises a FinFET structure comprising at least one fin disposed over a substrate, the at least one fin providing at least one channel region of at least one FinFET. The FinFET structure also comprises at least one gate region of the at least one FinFET surrounding the at least one channel region of the at least one fin, at least one gate spacer surrounding the at least one gate region, and at least one source/drain region of the at least one FinFET disposed over a portion of the at least one fin adjacent the at least one gate spacer. The FinFET structure further comprises a first interlayer dielectric layer disposed over the first portion of the at least one source/drain contact, the at least one gate spacer and the at least one gate region, and a second interlayer dielectric layer disposed over the first interlayer dielectric layer. The FinFET structure further comprises at least one source/drain contact to the at least one source/drain region, the at least one source/drain contact comprising a first portion disposed over the at least one source/drain region, a second portion disposed over the first portion in a first opening in the first interlayer dielectric layer, and a third portion disposed over the second portion in a second opening in the second interlayer dielectric layer. The second opening is larger than the first opening.

BRIEF DESCRIPTION OF THE DRAWINGS

FIG. 8 depicts a cross-sectional view of the FIG. 7 structure following source/drain contact metallization, according to an embodiment of the invention.

DETAILED DESCRIPTION

Figure 1:
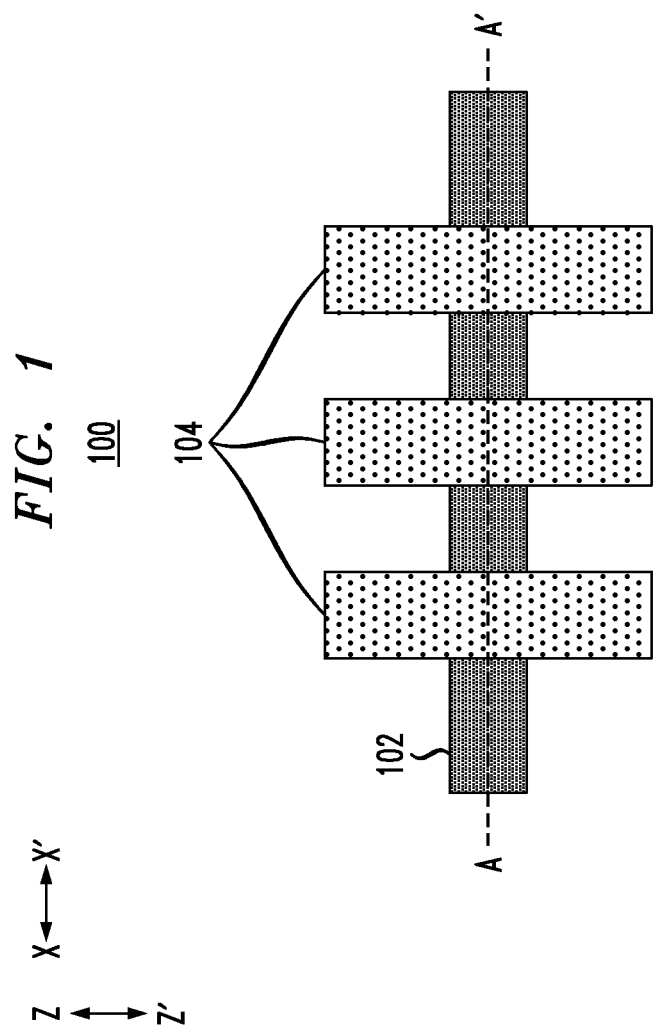
FIG. 1 depicts a top-down view of a semiconductor structure include a fin and multiple gate regions, according to an embodiment of the invention.

Illustrative embodiments of the invention may be described herein in the context of illustrative methods for forming middle-of-line (MOL) contacts with varying contact area to reduce MOL contact resistance, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Various techniques may be used to reduce the size of FETs. One technique is through the use of fin-shaped channels in FinFET devices. Before the advent of FinFET arrangements, CMOS devices were typically substantially planar along the surface of the semiconductor substrate, with the exception of the FET gate disposed over the top of the channel. FinFETs utilize a vertical channel structure, increasing the surface area of the channel exposed to the gate. Thus, in FinFET structures the gate can more effectively control the channel, as the gate extends over more than one side or surface of the channel. In some FinFET arrangements, the gate encloses three surfaces of the three-dimensional channel, rather than being disposed over just the top surface of a traditional planar channel.

FinFET devices may include fins with source/drain regions on lateral sides of the fins, where current flows in a horizontal direction parallel to a substrate between source/drain regions at opposite ends of the fins in the horizontal direction. Such FinFET devices may be referred to herein as "horizontal" devices. As horizontal devices are scaled down, there is reduced space for gate regions and source/drain contacts, which can lead to increased MOL resistance for the source/drain contacts.

Some devices such as FinFETs may utilize self-aligned contact (SAC) processes for forming MOL contacts (e.g., source/drain contacts for the FinFETs). SAC processes, however, may require complex modules such as work function metal (WFM) chamfering, tungsten (W) gate recess, SAC capping layer formation, SAC etching, etc. Thus, there is a desire to utilize non-SAC processes for forming MOL contacts as non-SAC processes are simpler than SAC processes. Non-SAC processes, however, are extremely difficult to implement without sacrificing contact resistance as devices such as FinFETs continue to scale (e.g., to 7 nanometers (nm) and beyond) where the gate pitch is small (e.g., less than 50 nm).

Techniques are thus needed for enabling non-SAC processes for forming MOL contacts in devices with tight pitched gate structures. In some embodiments, SAC-like processes are used to form MOL contacts with varying contact area that reduce MOL contact resistance. While various embodiments are described below in the context of forming MOL source/drain contacts for FinFETs, it should be appreciated that the techniques described herein may be used to form other types of MOL contacts with reduced contact resistance.

As will be described in further detail below, some embodiments utilize two interlayer dielectric (ILD) layers where different sized openings are formed in the two ILD layers. A first opening is formed in a first ILD layer that exposes the underlying portion of a device where the MOL contact is to be formed (e.g., a source/drain contact to a source/drain region of a FinFET), and a second opening is formed in a second ILD layer formed over the first ILD layer, the second opening being larger than the first opening. The smaller first opening prevents undesired shorting of the MOL contact to other portions of a device (e.g., to gate regions of a FinFET). The second ILD layer is formed thicker than the first ILD layer, such that the larger second opening has an increased contact area that reduces the overall MOL contact resistance. The first and second openings may be formed using a two-stop contact open process (e.g., utilizing wet and dry etchings) that prevents such undesired shorting.

As noted above, various embodiments will be described below in the context of forming MOL source/drain contacts for FinFET devices. After source/drain metallization formation in a FinFET structure, a first thin ILD layer formed of a nitride such as silicon nitride (SiN) is deposited followed by a second thicker ILD layer formed of an oxide such as silicon oxide (SiOx). The first ILD layer may be referred to as a nitride stop layer, while the second ILD layer may be referred to as an oxide ILD layer. Contact openings are formed landing on the source/drain contact metallization through the oxide ILD layer and the nitride stop layer. The contact opening in the nitride stop layer has a size that is not larger than the underlying source/drain contact metallization (e.g., the contact opening in the nitride stop layer does not touch the gate spacer material adjacent to the source/drain contact metallization). An isotropic etch of the oxide ILD layer (selective to the nitride stop layer) is then performed, which enlarges the contact opening only in the oxide ILD layer. Metallization is then used to form source/drain contacts in the openings in the nitride stop layer and the oxide ILD layer. This integration generates a unique feature, where the source/drain contact has a smaller contact size in the nitride stop layer than in the oxide ILD layer.

Thus, in some embodiments a semiconductor structure (e.g., a FinFET structure) is formed where source/drain structures are formed in a portion of a substrate and gate structures are formed over portions of the substrate. A nitride stop layer and oxide ILD layer are deposited over the gate and source/drain structures, with source/drain contacts being formed through the nitride stop layer and the oxide ILD layer with the contact opening in the oxide ILD layer being larger than the contact opening in the nitride stop layer.

Illustrative processes for non-SAC MOL contacts will now be described with respect to FIGS. 1-8. FIG. 1 shows a top-down view 100 of a semiconductor structure, including a fin 102 and gate structures 104 formed over the fin. The cross-sectional views of FIGS. 2-9 described below are taken along the line A-A' in the top-down view 100 (e.g., the cross-sectional views of FIGS. 2-9 are taken along or perpendicular to the fin 102).

Figure 2:
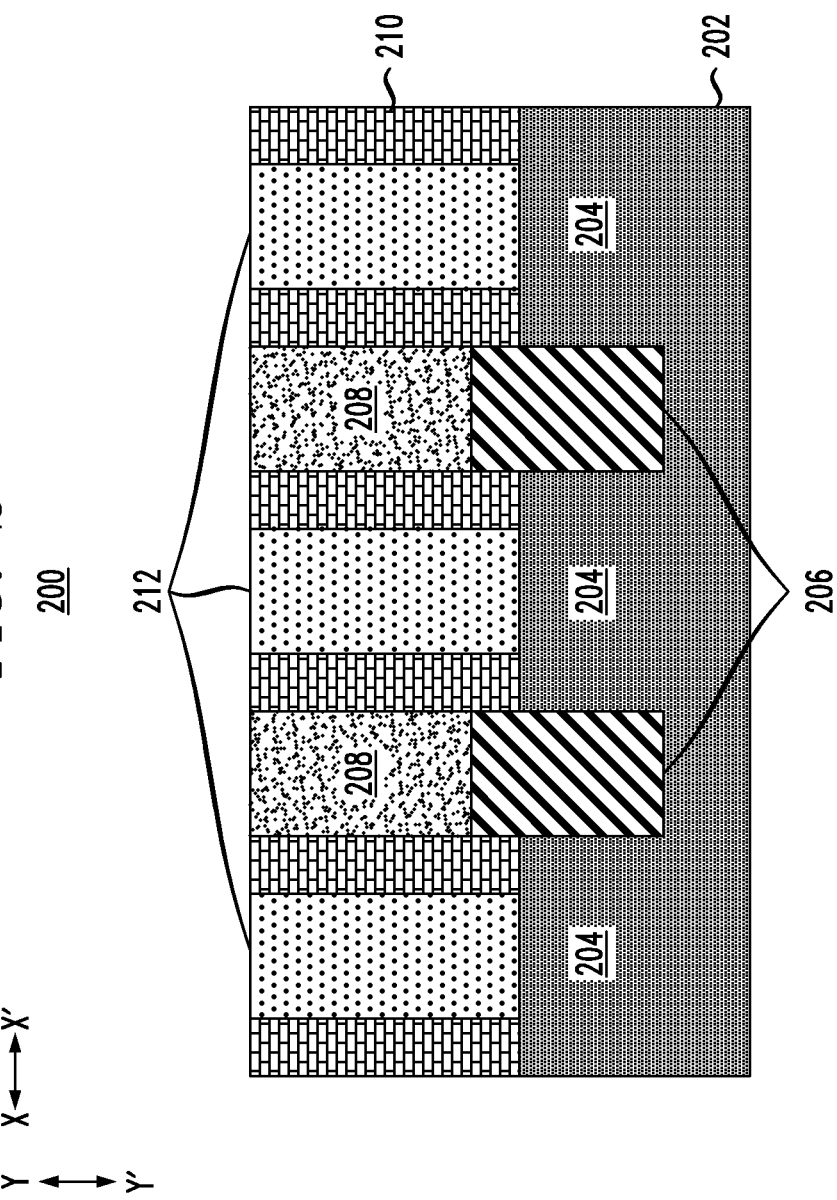
FIG. 2 depicts a cross-sectional view of a fin-type field-effect transistor structure following formation of gate regions, according to an embodiment of the invention.

FIG. 2 shows a cross-sectional view 200 of a semiconductor structure, more particularly a complementary metal-oxide-semiconductor (CMOS) FinFET structure following formation of gate structures. The FIG. 2 structure includes a substrate 202 and fin 204. The fin 204 may be formed from the substrate 202, such as by sidewall image transfer (SIT), lithography followed by etching (e.g., using reactive-ion etching (RIE)), or other suitable processing. Source/drain regions 206 are formed as illustrated, along with ILD layers 208, gate spacers 210 and gate structures 212.

The substrate 202 may comprise bulk silicon (Si), or another suitable substrate material, e.g., a bulk semiconductor, a semiconductor-on-insulator (SOI) substrate, etc. In some embodiments, the substrate 202 includes a silicon-containing material. Illustrative examples of Si-containing materials suitable for the substrate 102 can include, but are not limited to, Si, silicon germanium (SiGe), carbon doped silicon germanium (SiGe:C), silicon germanium carbide (SiGeC), carbon-doped silicon (Si:C), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc.

The fin 204 provides channels for the FinFET devices. The fin 204 may have a height or vertical thickness (in direction Y-Y') in the range of 30 nm to 100 nm. The fin 204 may have a channel length between adjacent ones of the source/drain regions 206 (in direction X-X') in the range of 50 nm to 500 nm.

The source/drain regions 206 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants or p-type dopants, depending on the type of transistor. The dopant concentration can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$. The implantation of suitable dopants may be performed using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl).

The source/drain regions 206 may have a height or vertical thickness (in direction Y-Y') in the range of 10 nm to 100 nm. The source/drain regions 206 may have a width or horizontal thickness (in direction X-X') that is defined by the difference between the gate pitch and the gate length plus twice the gate spacer thickness.

ILD layers 208 are formed over each of the source/drain regions 206 as illustrated in FIG. 2. The ILD layers 208 may be formed of silicon oxide (SiO), a thin (e.g., less than 5 nm) layer of SiN followed by SiO, or another suitable material. The ILD layers 208 have a width or horizontal thickness (in direction X-X') which matches that of the underlying source/drain regions 206. The ILD layers 208 may have a height or vertical thickness (in direction Y-Y') such that top surfaces of the ILD layers 208 match the top surface of the gate structures 212.

Gate spacers 210 are formed over the fin 204 adjacent sidewalls of the source/drain regions 206 and the ILD layers 208. The gate spacers 210 may be formed of SiN or another suitable material such as silicon boron carbide nitride (SiBCN), silicon oxy-carbon nitride (SiOCN), silicon carbonitride (SiCN), silicon carbide oxide (SiCO), etc. The gate spacers 210 may have a width or vertical thickness (in direction X-X') in the range of 3 nm to 10 nm. The gate spacers 210 may have a height or vertical thickness (in direction Y-Y') that matches that of the gate structures 212.

The gate structures 212 may include a gate dielectric formed over the sidewalls and top of the fin 204, and a gate conductor formed over the gate dielectric. The gate structures 212 may have a height or vertical thickness (in direction Y-Y'), as measured from a top surface of the fin 204, in the range of 15 nm to 150 nm. As noted above, the gate structures 212 wrap around three sides of the fin 204, and thus are taller adjacent edges of the fin 204 to the top surface of the substrate 202.

The gate dielectric of the gate structures 212 may be formed of a high-k dielectric material. Examples of high-k materials include but are not limited to metal oxides such as hafnium oxide (HfO$_2$), hafnium silicon oxide (Hf—Si—O), hafnium silicon oxynitride (HfSiON), lanthanum oxide (La$_2$O$_3$), lanthanum aluminum oxide (LaAlO$_3$), zirconium oxide (ZrO$_2$), zirconium silicon oxide, zirconium silicon oxynitride, tantalum oxide (Ta$_2$O$_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k may further include dopants such as lanthanum (La), aluminum (Al), magnesium (Mg), etc. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

The gate conductor of the gate structures 212 is illustratively formed of a metal or WFM. Examples of suitable metal materials for the gate conductor include tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), etc. Examples of suitable WFM materials for the gate conductor titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC), hafnium carbide (HfC), and combinations thereof.

Figure 3:
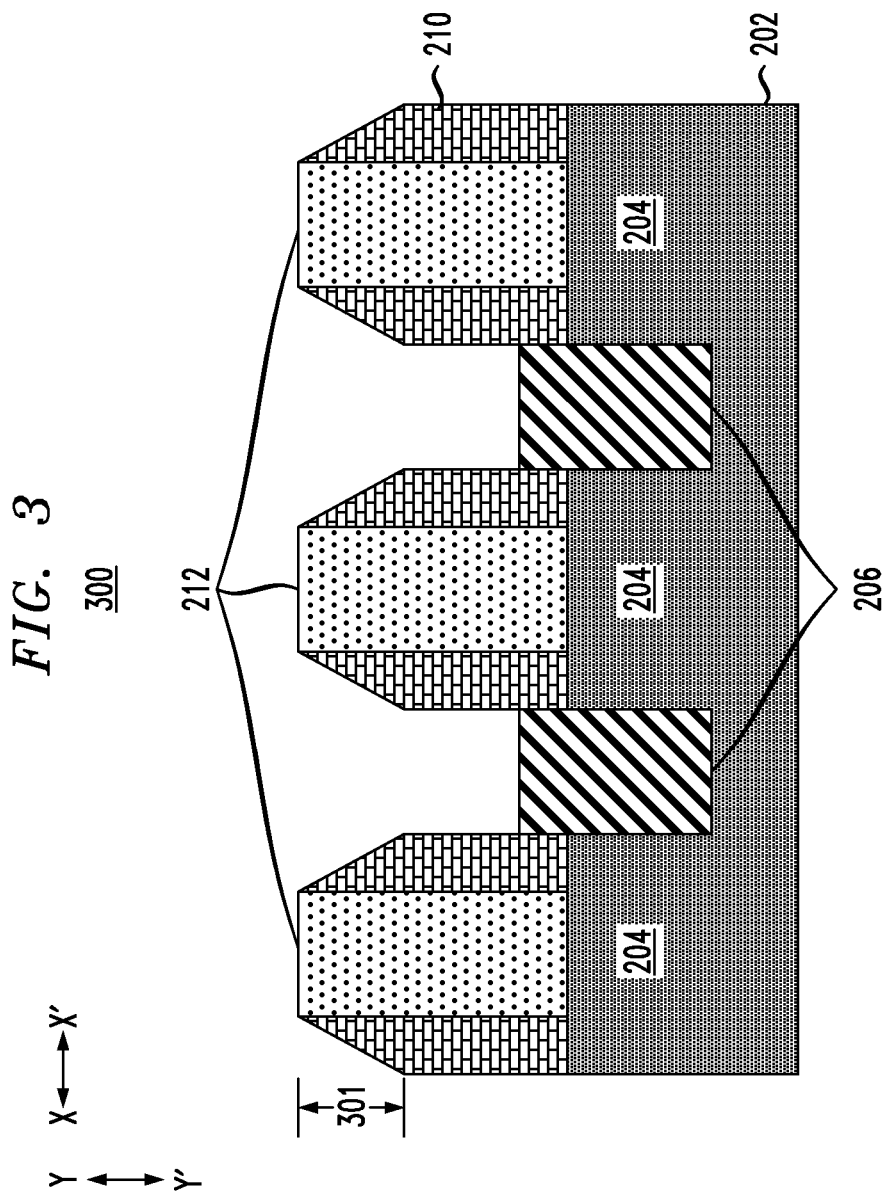
FIG. 3 depicts a cross-sectional view of the FIG. 2 structure following patterning for source/drain contacts, according to an embodiment of the invention.

FIG. 3 shows a cross-sectional view 300 of the FIG. 2 structure following source/drain contact patterning. The source/drain contact patterning uses a SAC-like process, but without a SAC capping layer. The source/drain contact patterning removes the ILD layers 208, such as using a dry etching process that is selective to the material of the gate spacers 210. The contact etching, as shown in FIG. 3, may result in corner erosion of the gate spacers 210 (e.g., corner erosion to a depth 301 of approximately 10 to 12 nm in some embodiments). Corner erosion of the gate spacers 210 will be addressed in later processing described below.

Figure 4:
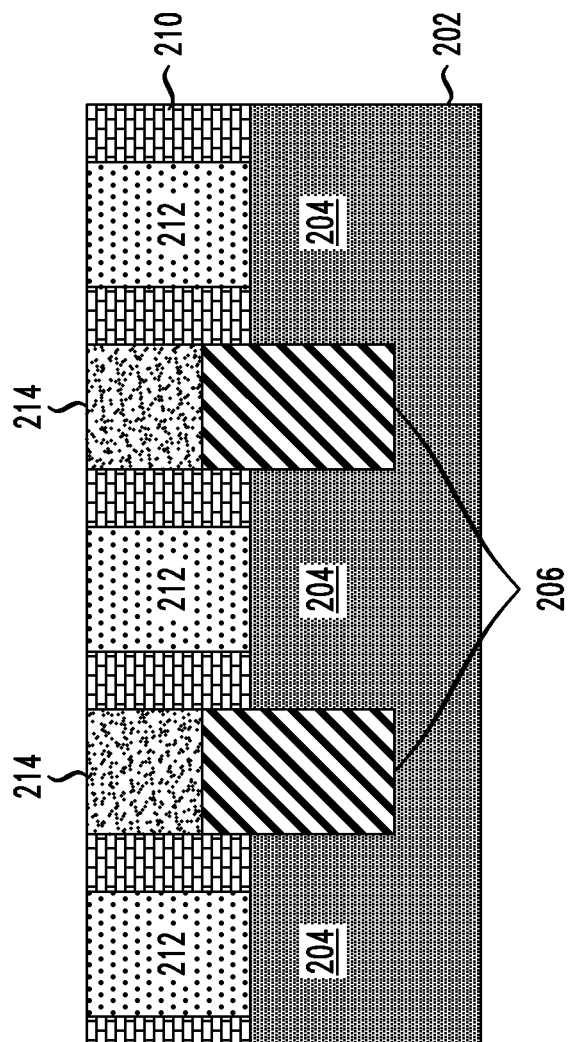
FIG. 4 depicts a cross-sectional view of the FIG. 3 structure following metallization and planarization of a portion of source/drain contacts, according to an embodiment of the invention.

FIG. 4 shows a cross-sectional view 400 of the FIG. 3 structure following source/drain contact metallization to form a source/drain contact portions 214, as well as planarization that removes portions of the gate spacers 210 with eroded corners. The contact metallization may include depositing a liner, such as Ti, TiN, Pt, Ni, etc., followed by a contact metal such as Co or W. The source/drain contact portions 214 have a height or vertical thickness (in direction Y-Y') in the range of 15 nm to 140 nm.

The contact material used for source/drain contact portions 214 may initially be formed to overfill the FIG. 3 structure, followed by planarization (e.g., using chemical mechanical planarization (CMP)) to result in the structure shown in FIG. 4. This planarization may "over polish" to remove the portions of the gate spacers 210 having eroded corners.

Figure 5:
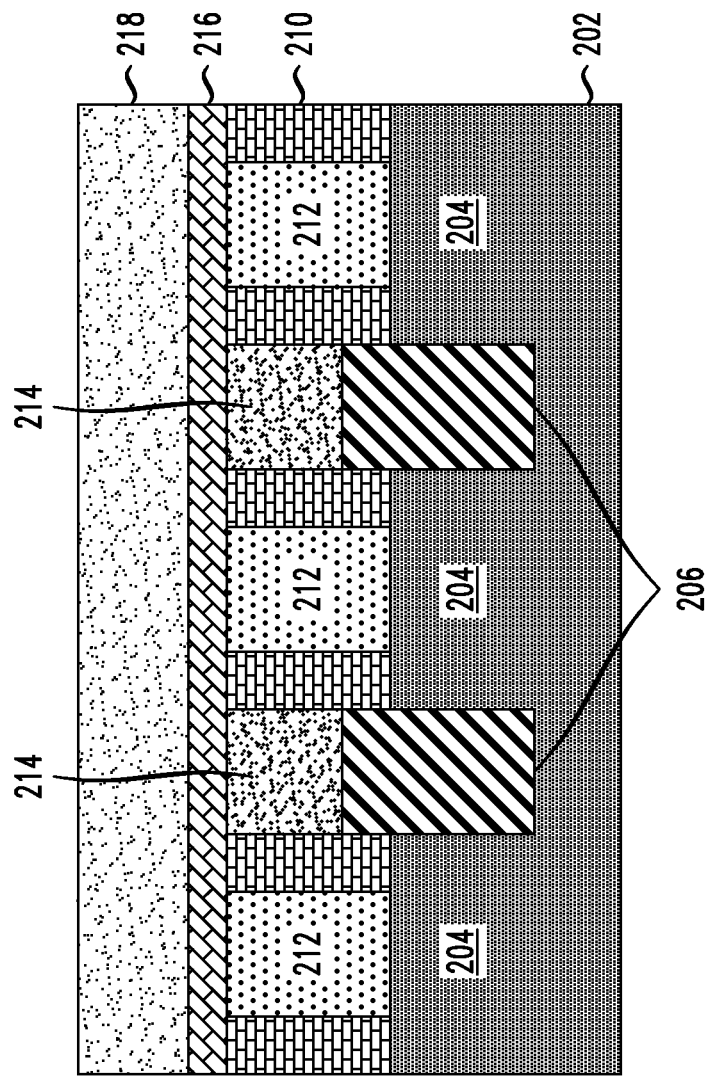
FIG. 5 depicts a cross-sectional view of the FIG. 4 structure following deposition of interlayer dielectric layers, according to an embodiment of the invention.

FIG. 5 shows a cross-sectional view 500 of the FIG. 4 structure following deposition of first and second ILD layers, referred to herein as stop layer 216 and ILD layer 218. The stop layer 216 and ILD layer 218 may be formed using any suitable deposition process, such as atomic layer deposition (ALD), chemical vapor deposition (CVD), physical vapor deposition (PVD), etc. The stop layer 216 may be formed of a nitride such as SiN, SiBCN, SiCN, SiOCN, etc., and thus may be referred to herein as nitride stop layer 216. The ILD layer 218 may be formed of an oxide such as $SiO_2$, and thus may be referred to herein as oxide ILD layer 218. The nitride stop layer 216 may have a height or vertical thickness (in direction Y-Y') of 5 nm, or more generally in the range of 3 nm to 10 nm. The oxide ILD layer 218 may have a height or vertical thickness (in direction Y-Y') in the range of 10 to 30 nm.

Figure 6:
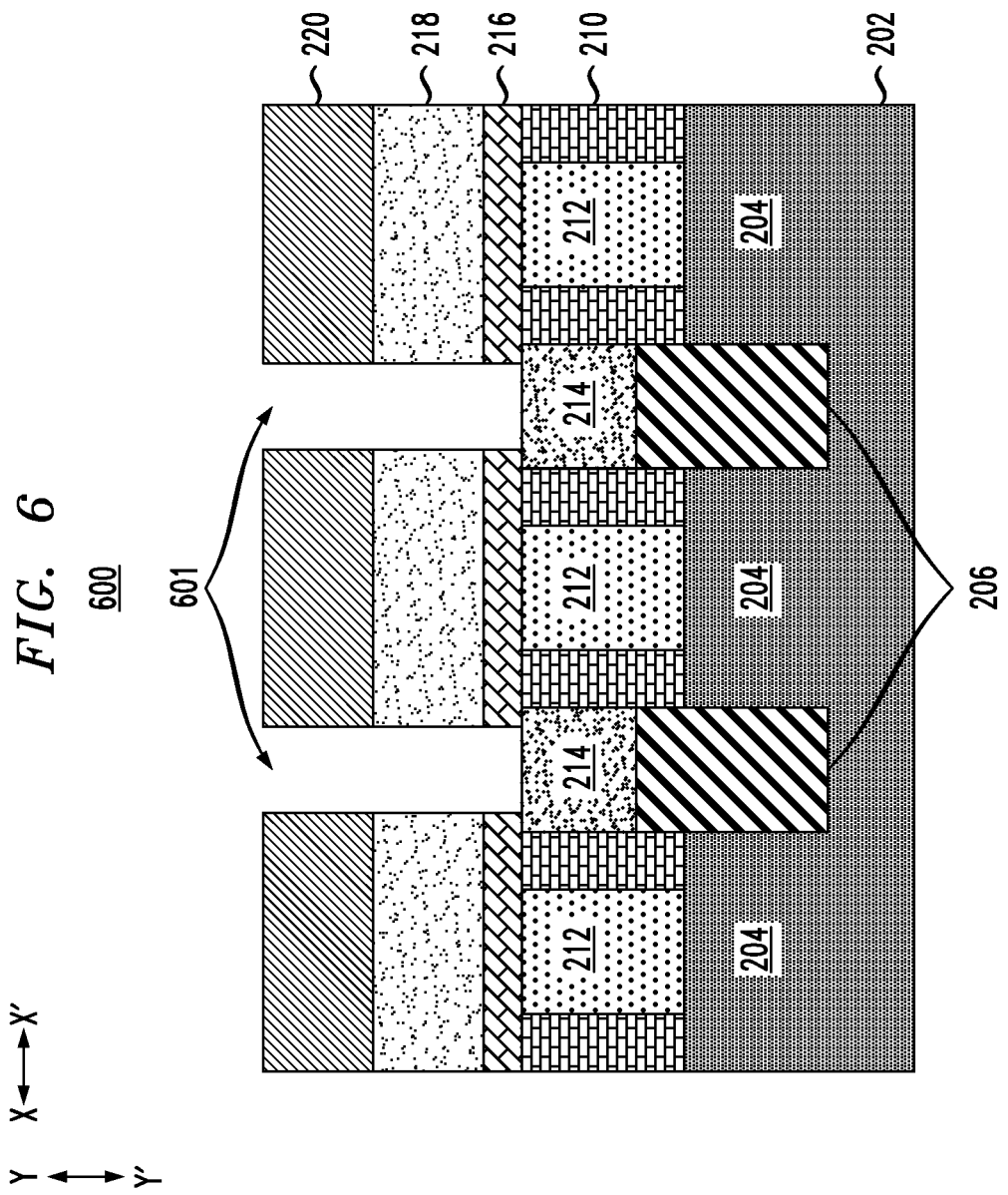
FIG. 6 depicts a cross-sectional view of the FIG. 5 structure following patterning of a mask to form openings in the interlayer dielectric layers for source/drain contacts, according to an embodiment of the invention.

FIG. 6 shows a cross-sectional view 600 of the FIG. 5 structure following formation and patterning of a mask layer 220 over the oxide ILD layer 218, and following etching of exposed portions of the oxide ILD layer 218 and underlying nitride stop layer 216 to form openings 601 to the underlying source/drain contact portions 214. Contact size is a critical feature. If the size of the openings 601 to the underlying source/drain contact portions 214 is too small, there is no shorting to the gate structures 212 but the contact resistance is high. If the size of the openings 601 to the underlying source/drain contact portions 214 is too large, there is low contact resistance but the possibility of shorting to the gate structures 212. The size of the openings 601, in some embodiments, is determined by the size of the underlying source/drain contact portions 214 and the contact overlay margin. For example, the underlying source/drain contact portions 214 may have a width or horizontal thickness (in direction X-X') in the range of 10 nm to 30 nm, and the openings 601 may have a width of horizontal thickness (in direction X-X') in the range of 7 nm to 27 nm.

Figure 7:
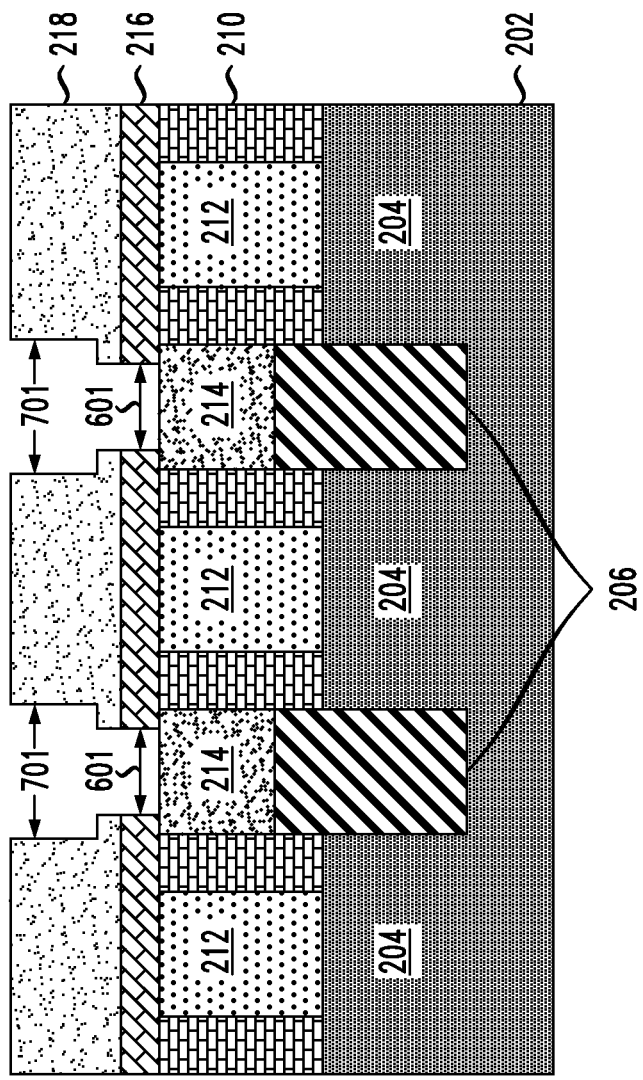
FIG. 7 depicts a cross-sectional view of the FIG. 6 structure following formation of additional openings in a top one of the interlayer dielectric layers for the source/drain contacts, according to an embodiment of the invention.

FIG. 7 shows a cross-sectional view 700 of the FIG. 6 structure following formation of additional openings 701 in the oxide ILD layer 218 while maintaining the size of the opening 601 in the nitride stop layer 216. This may be achieved by using a selective etch process that etches the material of the oxide ILD layer 218 (e.g., $SiO_2$) selective to the material of the nitride stop layer 216 (e.g., SiN). Thus, the openings 701 are enlarged in the oxide ILD layer 218 without increasing the likelihood or probability of shorting to the gate structures 212 because of the underlying nitride stop layer 216 with the narrower openings 601. The openings 701 may have a width or horizontal thickness (in direction X-X') in the range of 10 nm to 35 nm.

The additional openings 701 may be formed by selective etching of the oxide ILD layer 218, such as using a dry or wet oxide etch. The oxide etch enlarges the size of the contact opening in the oxide ILD layer 218, and thus reduces the total contact resistance The mask layer 220 may be removed before or after the oxide etch. In some embodiments, it is preferred to remove the mask layer 220 prior to the oxide etch.

FIG. 8 shows a cross-sectional view 800 of the FIG. 7 structure following additional contact metallization in the openings 601 and 701, forming source/drain contacts 222 (which include the previously metallized source/drain contact portions 214 described above). The contact material used may be the same as that used for formation of source/drain contact portions 214.

The contact resistance for the source/drain contacts 222 is a function of a resistance of the upper portion of the source/drain contacts 222 (formed in openings 701) denoted $R_U$, and a resistance of the lower portion of the source/drain contacts 222 (formed in openings 601) denoted $R_L$. The overall resistance of the source/drain contacts 222 is determined as $R_{contact}=R_U+R_L$. $R_U$ may be computed as $R_U=\rho*t_2/A$, where $\rho$ denotes the resistivity of the contact metal used, $t_2$ denotes the thickness of the oxide ILD layer 218 (e.g., where $t_2$ may be approximately 30 nm, as compared to the thickness $t_1$ of the nitride stop layer 216 which may be approximately 10 nm), and A denotes the contact area. Since the majority portion of the source/drain contacts 222 are formed in the openings 701 in the oxide ILD layer 218, the total resistance of the source/drain contacts 222 can be reduced significantly.

Figure 9:
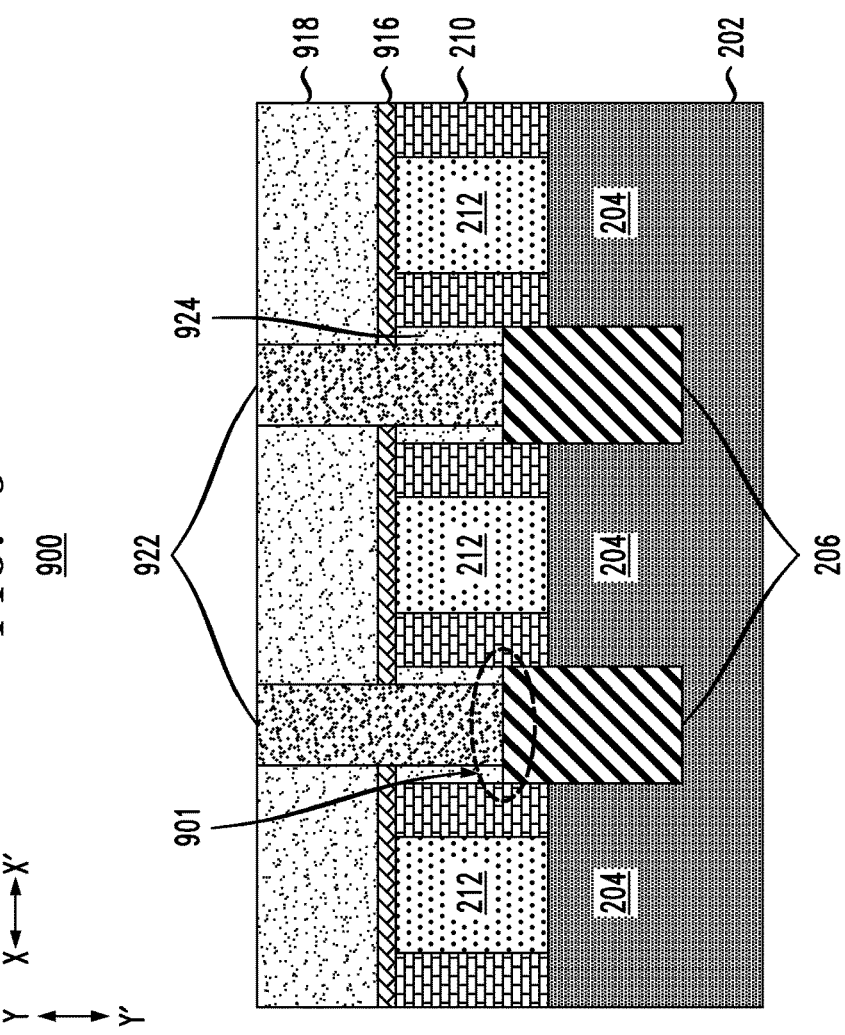
FIG. 9 depicts a cross-sectional view of a fin-type field-effect transistor structure with increased contact resistance, according to an embodiment of the invention.

FIG. 9 shows a cross-sectional view 900 of a FinFET structure with increased contact resistance relative to the FIG. 8 structure. Similar elements in the FIG. 9 structure are labeled with similar reference numerals. Whereas the FIG. 8 structure includes larger source/drain contact portions 214 (e.g., which abut the sidewalls of the adjacent gate spacers 210), the FIG. 9 structure includes an additional oxide layer 924 between the gate spacers 210 and the source/drain contacts 922. Since the additional opening is not formed in the oxide ILD layer 918 in the FIG. 9 structure, the overall contact resistance is higher as there is less contact area 901 in the source/drain contacts 922 (due to the reduced width or horizontal thickness in direction X-X').

Figure 10:
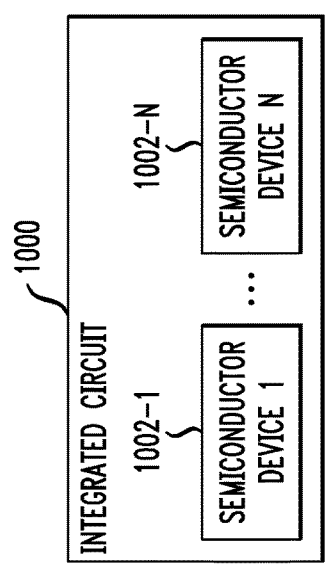
FIG. 10 depicts a block diagram of an integrated circuit with a plurality of semiconductor devices formed according to one or more illustrative embodiments.

FIG. 10 depicts a block diagram of an integrated circuit 1000 with a plurality of semiconductor devices 1002-1 through 1002-N formed according to one or more illustrative embodiments. It is to be appreciated that at least one of the semiconductor devices 1002-1 through 1002-N comprises a semiconductor structure having source/drain contacts with reduced source/drain contact resistance formed using the processing described above with respect to FIGS. 1-8.

In some embodiments, a method of forming a semiconductor structure comprises forming a first portion of at least one source/drain contact over at least one source/drain region of at least one fin-type field-effect transistor, the at least one source/drain region being formed over at least one fin providing at least one channel region of the at least one fin-type field-effect transistor, the at least one source/drain region being adjacent at least one gate spacer surrounding at least one gate region of the at least one fin-type field-effect transistor. The method also comprises forming a first ILD layer over the first portion of the at least one source/drain contact, the at least one gate spacer and the at least one gate region, and forming a second ILD layer over the first ILD layer. The method further comprises forming a second portion of the at least one source/drain contact over the first portion of the at least one source/drain contact in a first opening in the first ILD, and forming a third portion of the at least one source/drain contact over the second portion of the at least one source/drain contact in a second opening in the second ILD layer. The second opening is larger than the first opening.

The first ILD layer may comprise a nitride material and the second ILD may comprise an oxide material. The nitride material may comprise at least one of SiN, SiBCN, SiCN, and SiOCN. The oxide material may comprise silicon oxide ($SiO_x$).

The first ILD layer may have a first thickness and the second ILD layer may have a second thickness, the second thickness being greater than the first thickness.

A contact area of the first opening may be smaller than a contact area between (i) the first portion of the at least one source/drain contact and (ii) the at least one source/drain region.

Forming the first portion of the at least one source/drain contact may comprise etching a third ILD layer formed over the at least one source/drain region to expose a top surface of the at least one source/drain region. Etching the third ILD layer may erode corners of the at least one gate spacer. Forming the first portion of the at least one source/drain contact may further comprise depositing a contact material over the at least one source/drain region, and planarizing the contact material, the at least one gate spacer and the at least one gate region, wherein planarizing the at least one gate spacer removes the eroded corners of the at least one gate spacer.

Forming the second and third portions of the at least one source/drain contact may comprise patterning a mask layer over a top surface of the second ILD layer to expose at least a portion of the top surface of the second ILD layer overlying the first portion of the at least one source/drain contact, and etching portions of the first ILD layer and the second ILD layer exposed by the mask layer to form the first opening. Forming the second and third portions of the at least one source/drain contact further may further comprise selectively etching the second ILD layer to enlarge the first opening to form the second opening in the second ILD layer, removing the mask layer, and depositing a contact material in the first and second openings to form the second and third portions of the at least one source/drain contact.

In some embodiments, a semiconductor structure comprises at least one fin disposed over a substrate, the at least one fin providing at least one channel region of at least one FinFET. The semiconductor structure also comprises at least one gate region of the at least one FinFET surrounding the at least one channel region of the at least one fin, at least one gate spacer surrounding the at least one gate region, and at least one source/drain region of the at least one FinFET disposed over a portion of the at least one fin adjacent the at least one gate spacer. The semiconductor structure further comprises a first ILD layer disposed over the first portion of the at least one source/drain contact, the at least one gate spacer and the at least one gate region, and a second ILD layer disposed over the first ILD layer. The semiconductor structure further comprises at least one source/drain contact to the at least one source/drain region, the at least one source/drain contact comprising a first portion disposed over the at least one source/drain region, a second portion disposed over the first portion in a first opening in the first ILD, and a third portion disposed over the second portion in a second opening in the second ILD layer. The second opening is larger than the first opening.

The first ILD layer may comprise a nitride material and the second ILD may comprise an oxide material. The nitride material may comprise at least one of SiN, SiBCN, SiCN, and SiOCN. The oxide material may comprise silicon oxide ($SiO_x$).

The first ILD layer may have a first thickness and the second ILD layer may have a second thickness, the second thickness being greater than the first thickness.

A contact area of the first opening may be smaller than a contact area between (i) the first portion of the at least one source/drain contact and (ii) the at least one source/drain region.

In some embodiments, an integrated circuit comprises a FinFET structure comprising at least one fin disposed over a substrate, the at least one fin providing at least one channel region of at least one FinFET. The FinFET structure also comprises at least one gate region of the at least one FinFET surrounding the at least one channel region of the at least one fin, at least one gate spacer surrounding the at least one gate region, and at least one source/drain region of the at least one FinFET disposed over a portion of the at least one fin adjacent the at least one gate spacer. The FinFET structure further comprises a first ILD layer disposed over the first portion of the at least one source/drain contact, the at least one gate spacer and the at least one gate region, and a second ILD layer disposed over the first ILD layer. The FinFET structure further comprises at least one source/drain contact to the at least one source/drain region, the at least one source/drain contact comprising a first portion disposed over the at least one source/drain region, a second portion disposed over the first portion in a first opening in the first ILD, and a third portion disposed over the second portion in a second opening in the second ILD layer. The second opening is larger than the first opening.

The first ILD layer may comprise a nitride material and the second ILD may comprise an oxide material. The nitride material may comprise at least one of SiN, SiBCN, SiCN, and SiOCN. The oxide material may comprise silicon oxide ($SiO_x$).

The first ILD layer may have a first thickness and the second ILD layer may have a second thickness, the second thickness being greater than the first thickness.

A contact area of the first opening may be smaller than a contact area between (i) the first portion of the at least one source/drain contact and (ii) the at least one source/drain region.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a first portion of at least one source/drain contact over at least one source/drain region of at least one fin-type field-effect transistor, the at least one source/drain region being formed over at least one fin providing at least one channel region of the at least one fin-type field-effect transistor, the at least one source/drain region being adjacent at least one gate spacer surrounding at least one gate region of the at least one fin-type field-effect transistor;
    forming a first interlayer dielectric layer over the first portion of the at least one source/drain contact, the at least one gate spacer and the at least one gate region;
    forming a second interlayer dielectric layer over the first interlayer dielectric layer;
    forming a second portion of the at least one source/drain contact over the first portion of the at least one source/drain contact in a first opening in the first interlayer dielectric layer; and
    forming a third portion of the at least one source/drain contact over the second portion of the at least one source/drain contact in a second opening in the second interlayer dielectric layer;
    wherein the second opening is larger than the first opening; and
    wherein top surfaces of the first portion of the at least one source/drain contact, the at least one gate spacer, and the at least one gate region are substantially coplanar.

2. The method of claim 1, wherein the first interlayer dielectric layer comprises a nitride material and the second interlayer dielectric layer comprises an oxide material.

3. The method of claim 2, wherein:
    the nitride material comprises at least one of silicon nitride (SiN), silicon boron carbon nitride (SiBCN), silicon carbon nitride (SiCN), and silicon oxy-carbon nitride (SiOCN); and
    the oxide material comprises silicon oxide ($SiO_x$).

4. The method of claim 1, wherein the first interlayer dielectric layer has a first thickness and the second interlayer dielectric layer has a second thickness, the second thickness being greater than the first thickness.

5. The method of claim 1, wherein a contact area of the first opening is smaller than a contact area between (i) the first portion of the at least one source/drain contact and (ii) the at least one source/drain region.

6. The method of claim 1, wherein forming the first portion of the at least one source/drain contact comprises etching a third interlayer dielectric layer formed over the at least one source/drain region to expose a top surface of the at least one source/drain region.

7. The method of claim 1 wherein forming the second and third portions of the at least one source/drain contact comprises:
    patterning a mask layer over a top surface of the second interlayer dielectric layer to expose at least a portion of the top surface of the second interlayer dielectric layer overlying the first portion of the at least one source/drain contact; and
    etching portions of the first interlayer dielectric layer and the second interlayer dielectric layer exposed by the mask layer to form the first opening.

8. The method of claim 1, wherein the at least one gate spacer has straight corners abutting the at least one gate spacer and the at least one gate region.

9. The method of claim 1, wherein corners of the at least one gate spacer abutting the first portion of the at least one source/drain contact have a straight vertical profile.

10. A method of forming a semiconductor structure, comprising:
    forming a first portion of at least one source/drain contact over at least one source/drain region of at least one fin-type field-effect transistor, the at least one source/drain region being formed over at least one fin providing at least one channel region of the at least one fin-type field-effect transistor, the at least one source/drain region being adjacent at least one gate spacer surrounding at least one gate region of the at least one fin-type field-effect transistor;
    forming a first interlayer dielectric layer over the first portion of the at least one source/drain contact, the at least one gate spacer and the at least one gate region;
    forming a second interlayer dielectric layer over the first interlayer dielectric layer;

forming a second portion of the at least one source/drain contact over the first portion of the at least one source/drain contact in a first opening in the first interlayer dielectric layer; and forming a third portion of the at least one source/drain contact over the second portion of the at least one source/drain contact in a second opening in the second interlayer dielectric layer;

wherein the second opening is larger than the first opening;

wherein forming the first portion of the at least one source/drain contact comprises etching a third interlayer dielectric layer formed over the at least one source/drain region to expose a top surface of the at least one source/drain region; and wherein etching the third interlayer dielectric layer erodes corners of the at least one gate spacer.

11. The method of claim 10, wherein forming the first portion of the at least one source/drain contact further comprises:

depositing a contact material over the at least one source/drain region; and planarizing the contact material, the at least one gate spacer and the at least one gate region, wherein planarizing the at least one gate spacer removes the eroded corners of the at least one gate spacer.

12. The method of claim 10, wherein the first interlayer dielectric layer comprises a nitride material and the second interlayer dielectric layer comprises an oxide material.

13. The method of claim 12, wherein:

the nitride material comprises at least one of silicon nitride (SiN), silicon boron carbon nitride (SiBCN), silicon carbon nitride (SiCN), and silicon oxy-carbon nitride (SiOCN); and the oxide material comprises silicon oxide ($SiO_x$).

14. The method of claim 10, wherein the first interlayer dielectric layer has a first thickness and the second interlayer dielectric layer has a second thickness, the second thickness being greater than the first thickness.

15. The method of claim 10, wherein a contact area of the first opening is smaller than a contact area between (i) the first portion of the at least one source/drain contact and (ii) the at least one source/drain region.

16. A method of forming a semiconductor structure, comprising:

forming a first portion of at least one source/drain contact over at least one source/drain region of at least one fin-type field-effect transistor, the at least one source/drain region being formed over at least one fin providing at least one channel region of the at least one fin-type field-effect transistor, the at least one source/drain region being adjacent at least one gate spacer surrounding at least one gate region of the at least one fin-type field-effect transistor;

forming a first interlayer dielectric layer over the first portion of the at least one source/drain contact, the at least one gate spacer and the at least one gate region;

forming a second interlayer dielectric layer over the first interlayer dielectric layer;

forming a second portion of the at least one source/drain contact over the first portion of the at least one source/drain contact in a first opening in the first interlayer dielectric layer; and forming a third portion of the at least one source/drain contact over the second portion of the at least one source/drain contact in a second opening in the second interlayer dielectric layer;

wherein the second opening is larger than the first opening;

wherein forming the second and third portions of the at least one source/drain contact comprises:

patterning a mask layer over a top surface of the second interlayer dielectric layer to expose at least a portion of the top surface of the second interlayer dielectric layer overlying the first portion of the at least one source/drain contact;

etching portions of the first interlayer dielectric layer and the second interlayer dielectric layer exposed by the mask layer to form the first opening;

selectively etching the second interlayer dielectric layer to enlarge the first opening to form the second opening in the second interlayer dielectric layer;

removing the mask layer; and depositing a contact material in the first and second openings to form the second and third portions of the at least one source/drain contact.

17. The method of claim 16, wherein the first interlayer dielectric layer comprises a nitride material and the second interlayer dielectric layer comprises an oxide material.

18. The method of claim 17, wherein:

the nitride material comprises at least one of silicon nitride (SiN), silicon boron carbon nitride (SiBCN), silicon carbon nitride (SiCN), and silicon oxy-carbon nitride (SiOCN); and the oxide material comprises silicon oxide ($SiO_x$).

19. The method of claim 16, wherein the first interlayer dielectric layer has a first thickness and the second interlayer dielectric layer has a second thickness, the second thickness being greater than the first thickness.

20. The method of claim 16, wherein a contact area of the first opening is smaller than a contact area between (i) the first portion of the at least one source/drain contact and (ii) the at least one source/drain region.

* * * * *